United States Patent
Lin et al.

(10) Patent No.: US 8,984,377 B2
(45) Date of Patent: Mar. 17, 2015

(54) STOPPING METHODS FOR ITERATIVE SIGNAL PROCESSING

(75) Inventors: Shou-Sheu Lin, Kaohsiung (TW); Je-An Lai, Kaohsiung (TW); Sun-Ting Lin, Kaohsiung (TW)

(73) Assignee: National Kaohsiung First University of Science and Technology, Kaohsiung (TW)

( * ) Notice: Subject to any disclaimer, the term of this patent is extended or adjusted under 35 U.S.C. 154(b) by 474 days.

(21) Appl. No.: 13/089,748

(22) Filed: Apr. 19, 2011

(65) Prior Publication Data
US 2012/0272125 A1 Oct. 25, 2012

(51) Int. Cl.
*H03M 13/00* (2006.01)
*H03M 13/29* (2006.01)

(52) U.S. Cl.
CPC ...... *H03M 13/2975* (2013.01); *H03M 13/2972* (2013.01); *H03M 13/6331* (2013.01); *H03M 13/6525* (2013.01); *H03M 13/6544* (2013.01)
USPC .................................................. 714/774

(58) Field of Classification Search
CPC ... H04L 1/0009; H04L 1/0057; H04L 1/0041; H04L 1/0071; H03M 13/35
USPC ............................................. 714/774
See application file for complete search history.

(56) References Cited

U.S. PATENT DOCUMENTS

| | | | |
|---|---|---|---|
| 5,446,747 A | 8/1995 | Berrou | |
| 6,518,892 B2 | 2/2003 | Shen et al. | |
| 6,700,937 B1 * | 3/2004 | Turin | 375/262 |
| 6,738,948 B2 | 5/2004 | Dinc et al. | |
| 6,879,648 B2 | 4/2005 | Ebel, Sr. et al. | |
| 6,891,485 B2 * | 5/2005 | Jaffe et al. | 341/81 |
| 6,898,254 B2 | 5/2005 | Wolf et al. | |
| 6,956,912 B2 | 10/2005 | Bass | |
| 8,397,141 B2 * | 3/2013 | Lapstun | 714/784 |
| 2003/0061561 A1 * | 3/2003 | Rifaat et al. | 714/774 |
| 2003/0142727 A1 * | 7/2003 | Monogioudis et al. | 375/147 |
| 2004/0022336 A1 * | 2/2004 | Yu et al. | 375/346 |
| 2004/0140915 A1 * | 7/2004 | Shen et al. | 341/50 |
| 2005/0015696 A1 | 1/2005 | Bune | |
| 2005/0022090 A1 * | 1/2005 | Cameron et al. | 714/755 |
| 2007/0011586 A1 * | 1/2007 | Belogolovyi et al. | 714/774 |
| 2009/0089643 A1 | 4/2009 | Hsieh | |

* cited by examiner

*Primary Examiner* — Albert Decady
*Assistant Examiner* — Enam Ahmed
(74) *Attorney, Agent, or Firm* — Ming Chow; Sinorica, LLC

(57) ABSTRACT

A stopping method for an iterative signal processing includes a first step of receiving the state signatures generated by the iterative signal processing. A next step includes accumulating the state signatures into a stopping index variable. A next step includes stopping iterative decoding when the stopping index variable is less than a predetermined threshold.

16 Claims, 8 Drawing Sheets

STOPPING METHODS FOR ITERATIVE SIGNAL PROCESSING

BACKGROUND OF THE INVENTION

1. Field of the Invention

The present invention is related to a data transfer system using iterative signal processing to decode convolutionally coded signals, and more particularly, to a turbo decoder by implementing the iterative decoding and a method to generate a stopping signal to stop the iterative decoding.

2. Description of the Prior Art

Turbo code is a capacity-approaching error correction code having high performance. Because of its high performance and proper decoding complexity, it has been widely used in many communication systems, such as CCSDS standard in deep space, DVB-RCS standard in broadcast systems, W-CDMA, WiMAX or 3GPP-LTE in cellular systems, etc.

The turbo decoding principle is further extended to other iterative signal processing such as serial turbo codes, hybrid turbo codes, turbo equalization, turbo detection, etc.

The turbo code disclosed in U.S. Pat. No. 5,446,747 is constructed by parallel concatenating two convolutional codes via an interleaver. Similar to '747, the conventional turbo decoder adopts iterative way to decode. The decoder is a decoding loop, which connects a first maximum a-posteriori (MAP) decoding module, an interleaver, a second MAP decoding module, and a deinterleaver in series. In that, the main function of MAP decoding module is to calculate a-posteriori probability (APP) and is usually implemented by the BCJR algorithm. The BCJR algorithm was published by Bahl et al. in IEEE Transactions on Information Theory in March 1974. Moreover, the prior art '747 disclosed that after receiving a data block, the data enters the decoding loop via the first MAP decoder. Then, one iteration of decoding is performed by the first MAP decoding, interleaving, the second MAP decoding and deinterleaving in order. The conventional turbo decoding performs iterative decoding using a fixed number of iterations. The more the number of iterations is performed, the higher the accuracy of data is obtained. The performance can be close to Shannon's channel capacity limit. However, when the number of iterations is increased, the performance improvement is reduced gradually and saturated accordingly. More iterations will only increase the power consumption and decoding delay, therefore it is necessary to have a stopping method to solve this problem.

When the turbo decoding is implemented in handheld or portable devices, power consumption is a very important issue. How to design a proper stopping method for iterative decoding is an issue to be resolved. By reviewing some presently known prior art, the stopping methods published by Wang et al. in IEEE ICASSP'06 in May 2006 were categorized into two classes. One class is based on soft information such as cross entropy (CE), sign change ratio (SCR), and sign difference ratio (SDR). The other is based on hard-decision information such as hard decision aided (HDA). The aforementioned prior art are good in saving the number of iterations for iterative decoding, but they suffer from shortcomings of requiring large memory and complicated calculations.

The operation related to the CE method published by Hagenauer et al. in IEEE Transactions on Information Theory in March 1996 is briefed in the following. Please refer to FIG. 1, it is a block diagram illustrating a turbo decoder with CE stopping method. The turbo decoder consists of a conventional turbo decoding module 10' and a stopping method module 20'. The turbo decoding module 10' basically is a decoding loop and comprises a first MAP decoding module (MAP1) 101', an interleaver ($\pi$) 103', a second MAP decoding module (MAP2) 102' and a deinterleaver ($\pi^{-1}$) 104'. The turbo decoding module 10' is configured to receive convolutionally coded signals and perform iterative decoding. When finishing one iteration, the a-priori information and/or extrinsic information is generated and transferred to the stopping method module 20'. The stopping method module 20' proceeds to calculate the cross-entropy at 201' and determine the stopping condition at 202'. It then outputs a stopping signal 203' to the turbo decoding module 10' so as to control whether to continue iterative decoding or not.

Still refer to the MAP decoding module in FIG. 1, the MAP decoding module is typically performed the logarithmic BCJR algorithm, which is easier to be implemented and also named as Log-MAP algorithm. The algorithm was published by Robertson in IEEE ICC'95 in June 1995. It is summarized as follows, where some of the superscripts and subscripts are omitted for convenience.

$$\tilde{\gamma}_k(s', s) = \frac{1}{2} u_k(L_a + L_s) + \frac{1}{2} L_p x_k^p,$$

$$\tilde{\alpha}_k(s) = \max_{s' \in S_{k-1}}^* \{\tilde{\alpha}_{k-1}(s') + \tilde{\gamma}_{k-1}(s', s)\} - H_k,$$

$$\tilde{\beta}_k(s') = \max_{s' \in S_{k+1}}^* \{\tilde{\beta}_{k+1}(s) + \tilde{\gamma}_k(s', s)\} - G_k,$$

$$L_d = \max_{(s',s) \in E^+}^* \{\tilde{\alpha}_k(s') + \tilde{\gamma}_k(s', s) + \tilde{\beta}_{k+1}(s)\} -$$

$$\max_{(s',s) \in E^-}^* \{\tilde{\alpha}_k(s') + \tilde{\gamma}_k(s', s) + \tilde{\beta}_{k+1}(s)\},$$

$$L_e = L_d - L_s - L_a,$$

where the subscript k is the kth time instant; $\tilde{\gamma}_k(s',s)$ is the branch metric from state s' to state s; $u_k \in \{+1, -1\}$ is the value of transmitted symbol; $E^+/E^-$ is the set of (s',s) branch pair corresponding to $u_k=+1/u_k=-1$, respectively; $\tilde{\alpha}_k(s)$ is the forward state metric; $\tilde{\beta}_k(s')$ is the backward state metric; $L_d/L_a/L_e$ are the APP/a-priori information/extrinsic information, respectively; $L_c$ is the channel reliability, $y_k^s$ is the value of received systematic information symbol, $L_s \triangleq L_c y_k^s$ is the log-likelihood ratio of $y_k^s$; $y_k^p$ is the value of received parity symbol, $L_p \triangleq L_c y_k^p$ is the log-likelihood ratio of $y_k^p$; $x_k^p$ is the value of transmitted parity symbol; $H_k$ and $G_k$ are the normalized term for $\tilde{\alpha}_k(s)$ and $\tilde{\beta}_k(s')$, respectively; and max*{a, b}=max(a,b)+ln(1+$e^{-|a-b|}$). Note that the dashed line in FIG. 1 such as $L_{d1}$ and $L_{p2}$ stands for the input or output signals of the turbo decoding module 10' for convenience.

At the ith iteration, the stopping method module receives the ith APP ($\vec{L}_{d1}^{(i)}=(L_{d1,1}^{(i)}, L_{d1,2}^{(i)}, \ldots, L_{d1,k}^{(i)}, \ldots, L_{d1,N}^{(i)})$), where N is data block length, of the first MAP decoding module and the ith extrinsic information ($\vec{L}_{e2}^{(i)}=(L_{e2,1}^{(i)}, L_{e2,2}^{(i)}, \ldots, L_{e2,N}^{(i)})$) of the second MAP decoding module from the turbo decoding module and the cross-entropy is calculated as $$T(i) \triangleq \sum_{k=1}^{N} \frac{|L_{e2,k}^{(i)} - L_{e2,k}^{(i-1)}|^2}{\exp(|L_{d1,k}^{(i)}|)},$$

where the $L_{e2,k}^{(i-1)}$ is the extrinsic information of the kth data bit of the second MAP decoding module at (i−1)th iteration and the exp (•) is exponential function. When the stopping condition is qualified as $$\frac{T(i)}{T(1)} < \varepsilon_s,$$

where $\varepsilon_s$ is a threshold developed in accordance with bit error rate (BER) performance requirement, then a stopping signal 203' is generated. The CE method is good in saving the number of iterations, but the drawbacks of requiring large memory (because the extrinsic information of entire data block $\vec{L}_{e2}^{(i-1)} = (L_{e2,1}^{(i-1)}, L_{e2,2}^{(i-1)}, \ldots, L_{e2,k}^{(i-1)}, \ldots, L_{e2,N}^{(i-1)})$ is required to be memorized) and complicated calculations such as N exponential operations and N division operations are obvious.

The SCR method was published by Shao et al. in IEEE Transactions on Information Theory in August 1999. It is a simplified version of the CE method.

$$T(i) \approx \delta_i \cdot C(i),$$

$$\delta_i = E\left[\frac{|L_{e2,k}^{(i)} - L_{e2,k}^{(i-1)}|^2}{\exp(|L_{d1,k}^{(i)}|)}\right],$$

$$C(i) = \sum_{k=1}^{N} [\operatorname{sgn}(L_{e2,k}^{(i)}) \oplus \operatorname{sgn}(L_{e2,k}^{(i-1)})],$$

where the $E[\cdot]$ is expectation function, the $\operatorname{sgn}(\cdot)$ is sign function, the $\oplus$ is exclusive OR logic, and $C(i)$ is the number of different signs of the extrinsic information between ith and (i−1)th iteration of the second MAP decoding module. When the stopping condition is qualified as $$\frac{C(i)}{N} < \varepsilon_s,$$

where $\varepsilon_s$ is a threshold developed in accordance with BER performance requirement, then a stopping signal is generated. Because the SCR method is simplified, the saving of the number of iterations is not as good as CE. Similar to the CE method, the SCR method is also required more memories (because the signs of the extrinsic information of entire data block are required to be memorized).

For the HDA method, it is another Shao's method. The HDA method is a further simplified version of the CE method. When the stopping condition is qualified as $$\operatorname{sgn}(L_{e2,k}^{(i)}) = \operatorname{sgn}(L_{e2,k}^{(i-1)})$$

for all k, then a stopping signal is generated. However, Shao et al. mentioned that the saving of iteration of the HDA method is not as good as the CE method or the SCR method in high SNR region. The HDA method is also required memories to store the signs of the extrinsic information of entire data block.

The SDR method was published by Wu et al. in IEEE Communications Letters in August 2000. It extends the idea of the SCR method to the a-priori information $\vec{L}_{aj}^{(i)} = (L_{aj,1}^{(i)}, L_{aj,2}^{(i)}, \ldots, L_{aj,k}^{(i)}, \ldots, L_{aj,N}^{(i)})$ and the extrinsic information $\vec{L}_{ej}^{(i)} = (L_{ej,1}^{(i)}, L_{ej,2}^{(i)}, \ldots, L_{ej,k}^{(i)}, \ldots, L_{ej,N}^{(i)})$ of a single MAP decoding module, where $j \in \{1, 2\}$ can be either the first MAP decoding module or the second MAP decoding module. When the stopping condition is qualified as $$\frac{\sum_{k=1}^{N} [\operatorname{sgn}(L_{aj,k}^{(i)}) \oplus \operatorname{sgn}(L_{ej,k}^{(i)})]}{N} < \varepsilon_s,$$

where $\varepsilon_s$ is a threshold developed in accordance with BER performance requirement, then a stopping signal is generated. The SDR method does not required extra memories to store the signs of the extrinsic information of entire data block. Comparing the number of iteration saving, the SDR method is the worst.

More stopping methods were also discussed in the paper of Wang et al. The major difference is the signals transferred to the stopping method module being the a-priori information and/or extrinsic information. There are some pros and cons between the number of iteration saving and the BER performance. Due to the fact that an entire data block of the a-priori information and/or extrinsic information is needed to transfer to the stopping method module, a common drawback is high complexity of calculations for stopping condition (because at least N operations are required to calculate the stopping condition).

Generally, when the turbo decoding module is converged, the a-priori information $\vec{L}_{aj}^{(i)}$, the extrinsic information $\vec{L}_{ej}^{(i)}$ or the APP in the entire data block will be converged. Using an entire data block to design the stopping methods are the conventional methods in the prior art, such as U.S. Pat. Nos. 6,738,948, 6,898,254, 6,518,892, 6,956,912, and U.S. Patent App. US 2005/0015696, etc. The prior art are intuitive, but the drawback of requiring large memory and/or complicated calculations is obvious.

SUMMARY OF THE INVENTION

According to the problems described above, the main object of the present invention is to provide a low complexity method for stopping the iterative decoding. The method for the iterative decoding not only preserves the performance of decoding and effectiveness in reducing the number of iterations in the prior art, but also includes the advantages of low memory requirement and without complicated calculations. In addition, when the method of the present invention used for stopping the iterative decoding is implemented in a chip, the present invention offers advantages in the saving of power consumption as well as in the effectiveness by reducing the chip area.

Another object of the present invention is to provide an iterative signal processor for decoding convolutionally coded signals. The iterative signal processor has a function to determine the stopping index for iterative signal processing, such that the number of iterations in the iterative decoding is reduced and as a result the requirements in memory needs and calculation operation are reduced. In comparison to the conventional iterative signal processing with the fixed number of iterative decoding, the present invention creates effectiveness in power saving as well as delay time saving.

Still another object of the present invention is to provide an apparatus for wireless communication. The apparatus have a function to determine the stopping index for iterative signal processing, such that the number of iterations in the iterative decoding is reduced and as a result the requirements in memory needs and calculation operation are reduced. In comparison to the conventional iterative signal processing with the fixed number of iterative decoding, the present invention creates effectiveness in power saving as well as delay time saving.

According to the objects above, the present invention provides A method for stopping an iterative MAP decoding of convolutionally coded signals, the method comprising: (a) selecting an integer value k, $1 \leq k \leq N+v$, where N is the data block length of said convolutionally coded signals and v is the memory length of said convolutionally coded signals; (b) providing at least one MAP decoding module to perform said iterative MAP decoding of said convolutionally coded signals; (c) generating a state metric signature vector at kth time instant by said MAP decoding module during said iterative MAP decoding; (d) accumulating state metric signatures in said state metric signature vector into a stopping index variable; (e) setting a predetermined threshold; (f) comparing said stopping index variable with said predetermined threshold; and (g) stopping said MAP iterative decoding when said stopping index variable is less than said predetermined threshold.

Furthermore the present invention provides a method for stopping an iterative MAP decoding of convolutionally coded signals, the method comprising: (a) selecting an integer value k, $1 \leq k \leq N+v$, where N is the data block length of said convolutionally coded signals and v is the memory length of said convolutionally coded signals; (b) providing at least one MAP decoding module to perform said iterative MAP decoding of said convolutionally coded signals; (c) generating a forward state metric signature vector at kth time instant by said MAP decoding module during said iterative MAP decoding; (d) generating a backward state metric signature vector at kth time instant by said MAP decoding module during said iterative MAP decoding; (e) accumulating each product of forward state metric signature in said forward state metric signature vector and backward state metric signature of same state in said backward state metric signature vector into a stopping index variable; (f) setting a predetermined threshold; (g) comparing said stopping index variable with said predetermined threshold; and (h) stopping said iterative MAP decoding when said stopping index variable is greater than said predetermined threshold.

In addition, the present invention provides an iterative signal processor for decoding convolutionally coded signals, comprising: an iterative signal processing module including a plurality of MAP decoding modules and said plurality of MAP decoding modules output at least one state metric signature vector at kth time instant during an iterative MAP decoding process performed by the iterative signal processor, wherein k is a selected integer value satisfying $1 \leq k \leq N+v$, where N is the data block length of said convolutionally coded signals and v is the memory length of said convolutionally coded signals; and a stopping method module including: an accumulator configured to accumulate a plurality of state metric signatures in said state metric signature vector into a stopping index variable; and a decision unit configured to compare said stopping index variable with a predetermined threshold, when said stopping index variable is less than said predetermined threshold, said decision unit will output a stopping signal to said iterative signal processing module, and said iterative MAP decoding is determined to be stopped.

BRIEF DESCRIPTION OF THE DRAWINGS

The foregoing aspects and many of the attendant advantages of this invention will become more readily appreciated as the same become better understood by reference to the following detailed description, when taken in conjunction with the accompanying drawings, wherein.

DESCRIPTION OF THE PREFERRED EMBODIMENT

Figure 1:
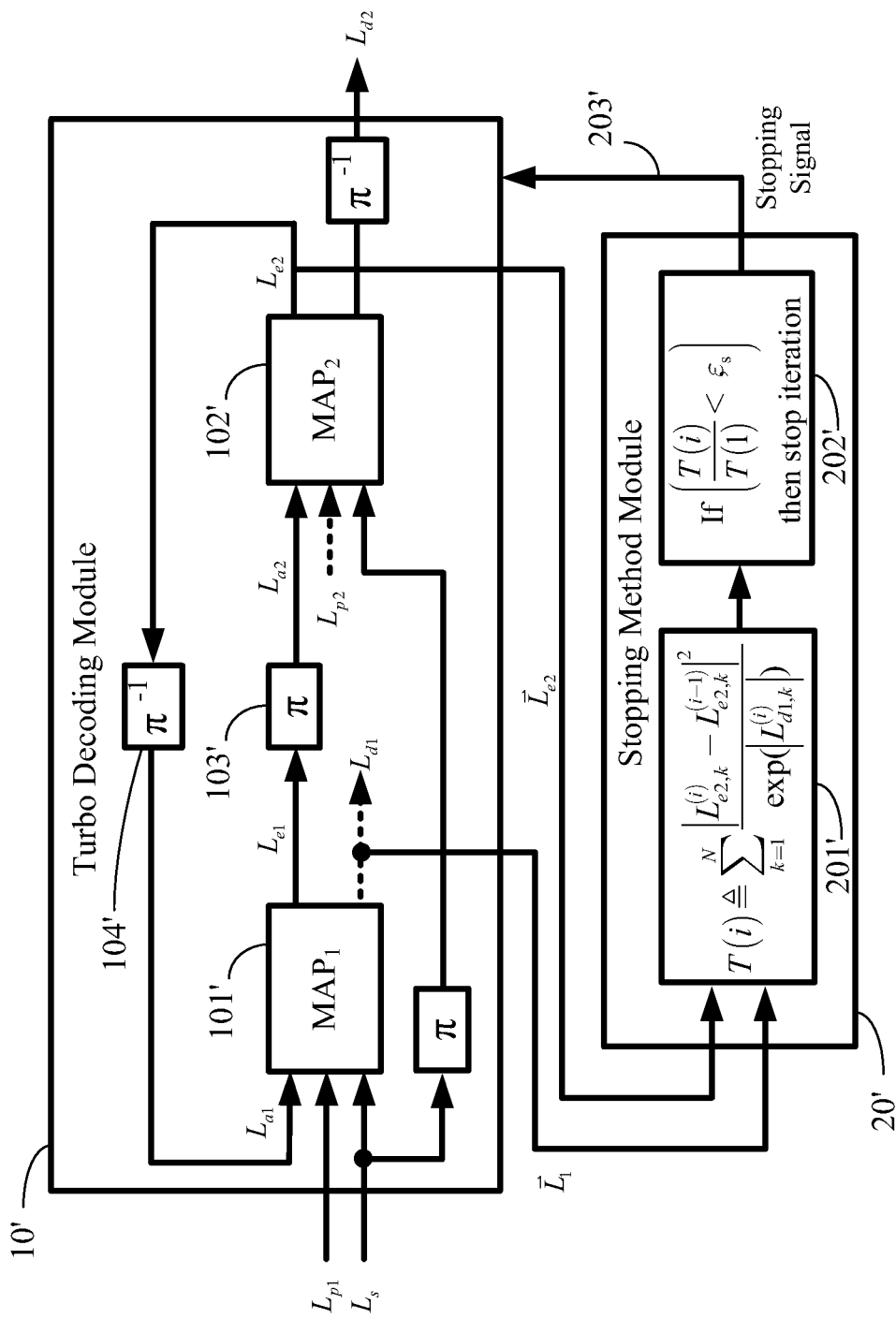
FIG. 1 is a schematic block diagram illustrating a conventional turbo decoder with the CE method.

The detailed description of the present invention will be discussed in the following embodiments, which are not intended to limit the scope of the present invention, but can be applicable to other applications.

Different from the concept in the prior art, a stopping method is disclosed in the present invention and the method is using the value of state metric at a particular time instant within the MAP decoding module during the iterative decoding process. It should be noted that the data generated at a particular time instant is used in the present invention instead of an entire data block. According the concept described above, a stopping method in the present invention is disclosed in the following.

Given a parallel turbo code of data block length N comprised two convolutional codes of v-bit memory with zero-state trellis termination and the Log-MAP algorithm is used as the MAP decoding module in a turbo decoding module, the MAP decoding module will calculate the state metric of states at time k during the iterative decoding process, where the state metric includes the forward state metric $\tilde{\alpha}_k(s)$ and the backward state metric $\tilde{\beta}_k(s)$. Because the state metric is a function of the a-priori information and the a-priori information is a function of the extrinsic information of entire data block $\vec{L}_e$, the state metric can be expressed as a function of the extrinsic information of entire data block. Therefore, the state metric can be a compact representation of $\vec{L}_e$. In more details, $$\tilde{\alpha}_k(s) = g_{\alpha,k}(L_{a,k}) = g_{\alpha,k}(h_{\alpha,k}(\vec{L}_e)) = f_{\alpha,k}(\vec{L}_e), \text{ for } 1 \leq k \leq N$$

where $f_{\alpha,k}(\bullet) = g_{\alpha,k}(h_{\alpha,k}(\bullet))$, $g_{\alpha,k}(\bullet)$ and $h_{\alpha,k}(\bullet)$ is a function at time k, respectively. Because $\tilde{\alpha}_k(s)$ is also a function of $L_{a,N}$ for $N < k \leq N+v$, the range of k can be extended to N+v, i.e., $$\tilde{\alpha}_k(s) = f_{\alpha,k}(\vec{L}_e) \text{ for } 1 < k \leq N+v.$$

Similarly, $$\tilde{\beta}_k(s) = g_{\beta,k+1}(L_{a,k+1}) = g_{\beta,k+1}(h_{\beta,k+1}(L_{a,k+1})) = f_{\beta,k+1}(\vec{L}_e)$$
$$\text{for } 0 \leq k \leq N-1$$

where $f_{\beta,k+1}(\bullet) = g_{\beta,k+1}(h_{\beta,k+1}(\bullet))$, $g_{\beta,k+1}(\bullet)$ and $h_{\beta,k+1}(\bullet)$ is a function at time k+1, respectively. Note that the range of k is different for the forward and backward state metric due to the nature of decoding algorithm. For convenience, the state metric including $\tilde{\alpha}_k(s)$ for $1 \leq k \leq N+v$ and $\tilde{\beta}_k(s)$ for $0 \leq k \leq N-1$ is defined as state metric signature $\rho_k(s)$, i.e., $\rho_k(s)$ is a common alias of $\tilde{\alpha}_k(s)$ and $\tilde{\beta}_k(s)$. In details, $\rho_k(s) = \tilde{\alpha}_k(s)$ or $\tilde{\beta}_k(s)$ for $1 \leq k \leq N-1$, $\rho_k(s) = \tilde{\beta}_k(s)$ for k=0, and $\rho_k(s) = \tilde{\alpha}_k(s)$ for $N \leq k \leq N+$ v. Moreover, the $\vec{\tilde{\alpha}}_k=[\tilde{\alpha}_k(0)\ \tilde{\alpha}_k(1)\ldots\tilde{\alpha}_k(S-1)]$ and $\vec{\tilde{\beta}}_k=[\tilde{\beta}_k(0)\ \tilde{\beta}_k(1)\ldots\tilde{\beta}_k(S-1)]$ is defined as the forward and backward state metric signature vector, respectively, where S is the total number of state of the convolutional code. The state metric signature vector $\vec{\rho}_k$ is defined as a common alias of the forward state metric signature vector $\vec{\tilde{\alpha}}_k$ and the backward state metric signature vector $\vec{\tilde{\beta}}_k$. When the turbo decoding module is converged, the $\vec{L}_e$ is converged accordingly. Thus, the state metric signature $\rho_k(s)$ which embedded the information of $\vec{L}_e$ can be used as a stopping index for turbo decoding. Because the state metric signature is a compact representation of $\vec{L}_e$, low-complexity stopping method is possible if the state metric signature is employed. The present invention uses the state metric signature to design the stopping method.

According to the definition of variables, the fundamental stopping method in the present invention is disclosed as follows. When a turbo decoder is doing the ith iteration, the stopping method module receives the state metric signature vector $\vec{\rho}_{j,k}^{(i)}$ of the jth MAP decoding module at ith iteration from the turbo decoder so as to calculate a stopping index $T_I$, where $$T_I \triangleq \sum_{\forall s \in S} \rho_{j,k}^{(i)}(s).$$

When $T_I < \epsilon_s$, the iterative decoding is stopped, where $\epsilon_s$ is a threshold developed in accordance with BER performance requirement. All other variants of the fundamental stopping method are extension of the present invention and it will be described later.

In order to make the description, features and advantages can be more clearly understood in the present invention, the detailed description of the following embodiments will be cooperated with the drawings.

For simplicity, a parallel turbo code of data block length N comprised two convolutional codes of v-bit memory with zero-state trellis termination is considered in the following embodiments and the Log-MAP algorithm is used as the MAP decoding module in the turbo decoding module.

The turbo decoding module 10 in the following embodiments of the present invention basically is a decoding loop, and the turbo decoding module 10 comprises a first MAP decoding module 101, an interleaver ($\pi$) 103, a second MAP decoding module 102 and a deinterleaver ($\pi^{-1}$) 104. The stopping method module 20 comprises an accumulator 201 and a decision unit 202. It then outputs a stopping signal 203 to the turbo decoding module 10 so as to control whether to continue iterative decoding or not.

The First Preferred Embodiment

Figure 2:
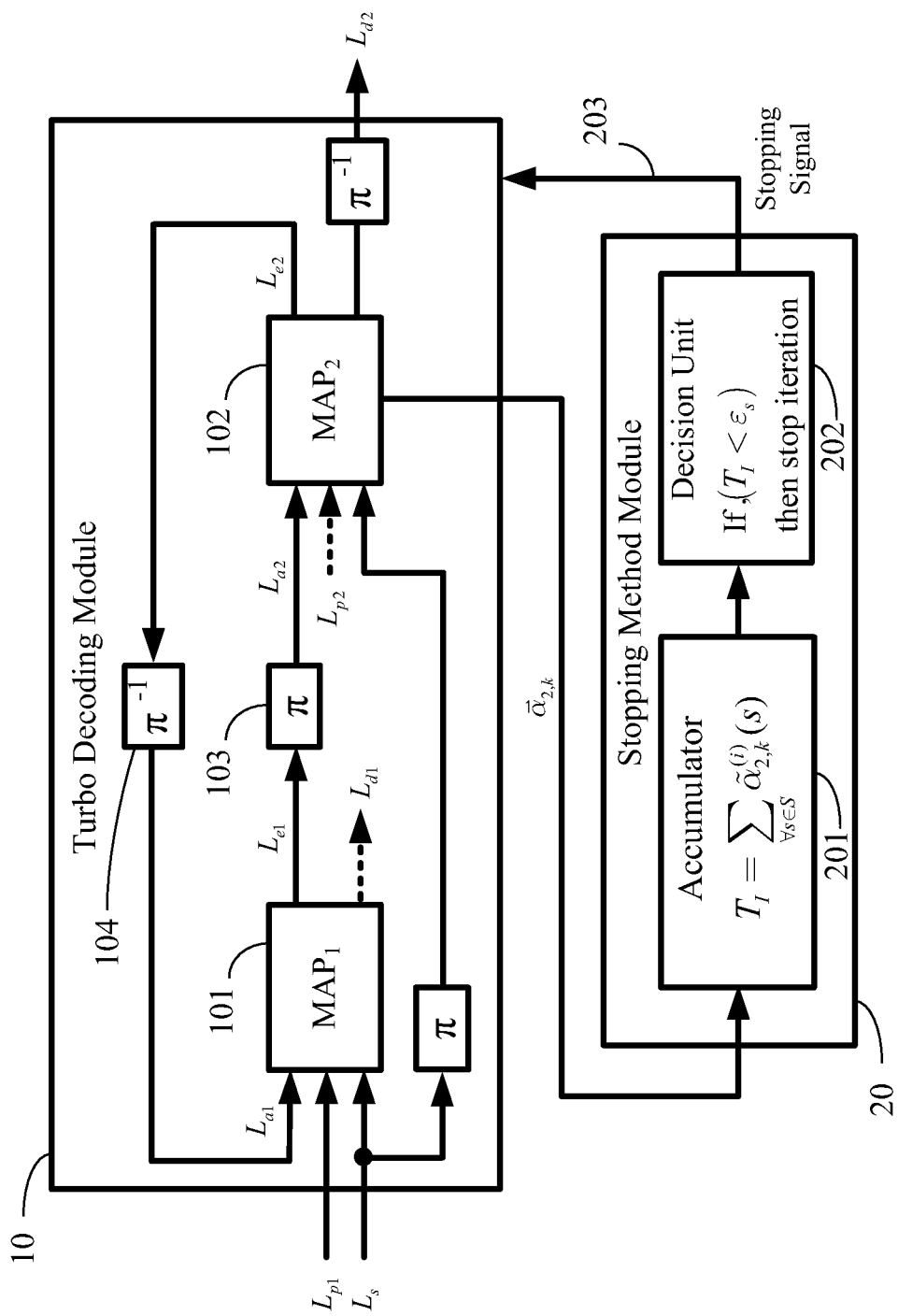
FIG. 2 is a block diagram illustrating a turbo decoder in the first embodiment of the present invention.

Please refer to FIG. 2, it is a block diagram illustrating the turbo decoder in the present invention. The present embodiment is configured to use the forward state metric signature vector $\vec{\tilde{\alpha}}_{2,k}$ (i.e., $\vec{\rho}_{2,k}^{(i)}=\vec{\tilde{\alpha}}_{2,k}^{(i)}$) generated by the second MAP decoding module 102. The forward state metric signatures of the second MAP decoding module 102 at the ith iteration are accumulated so as to calculate the stopping index $T_I$, where $$T_I \triangleq \sum_{\forall s \in S} \alpha_{2,k}^{(i)}(s).$$

The turbo decoding module 10 receives a data block and performs iterative decoding. At the ith iteration, the second MAP decoding module 102 will transfer the forward state metric signature vector $\vec{\tilde{\alpha}}_{2,k}$ to the stopping method module 20. The accumulator 201 of the stopping method module 20 will accumulate all the forward state metric signatures $\alpha_{2,k}^{(i)}(s)$ and save the result in the stopping index variable $T_I$, i.e., $$T_I \triangleq \sum_{\forall s \in S} \alpha_{2,k}^{(i)}(s).$$

Then, the decision unit 202 will compare the accumulated result of the stopping index variable $T_I$ with a threshold $\epsilon_s$. When the stopping index is less than the predetermined threshold, i.e., $T_I < \epsilon_s$, then the stopping signal 203 is generated to the turbo decoding module 10 so as to stop the iterative decoding. Otherwise, the iteration is repeated until the stopping condition is fulfilled ($T_I < \epsilon_s$) or a fixed number of iterations are performed.

The Second Preferred Embodiment

Figure 3:
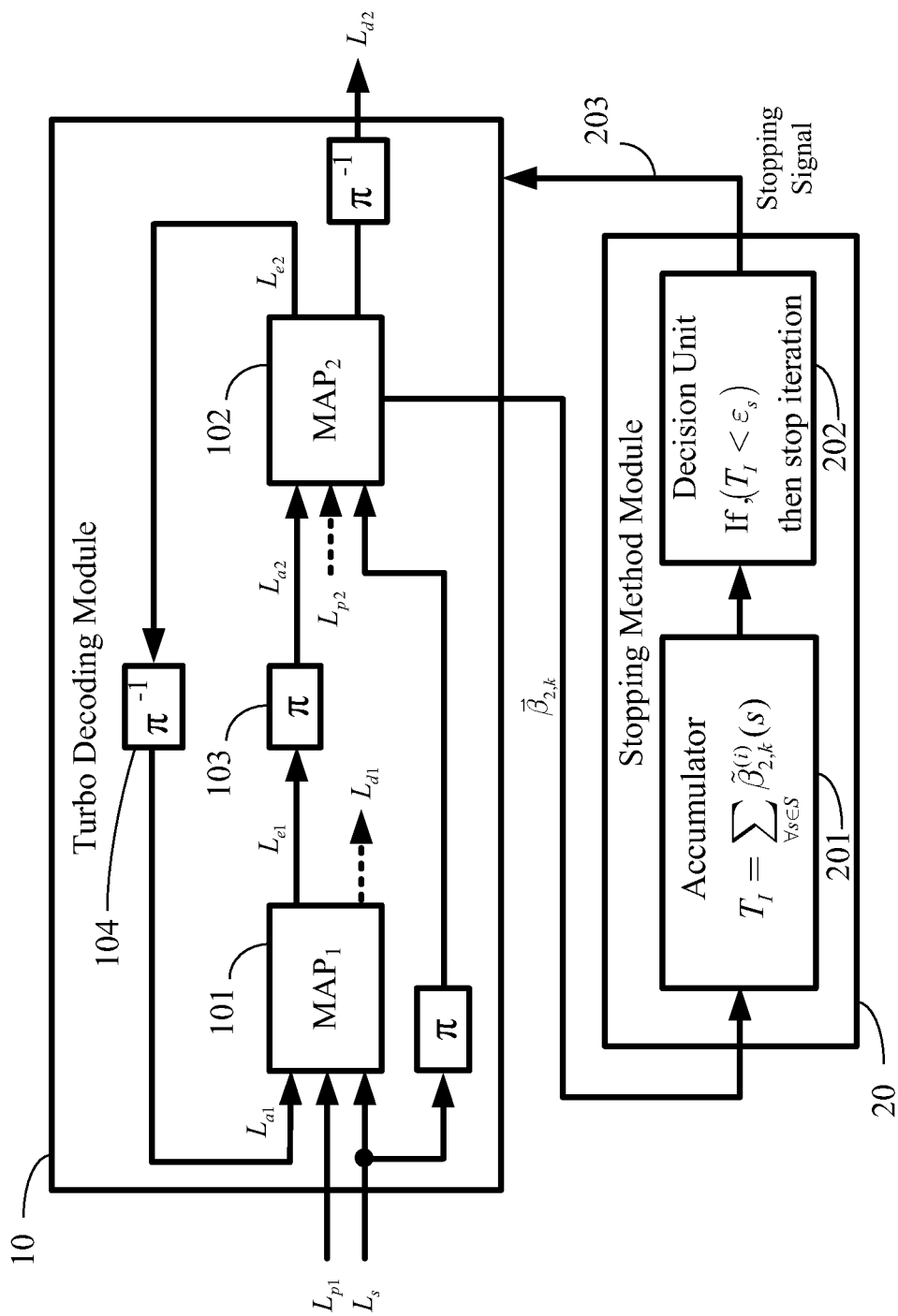
FIG. 3 is a block diagram illustrating a turbo decoder in the second embodiment of the present invention.

The present embodiment is similar to the first embodiment. Instead of using $\vec{\tilde{\alpha}}_{2,k}$ the backward state metric signature vector $\vec{\tilde{\beta}}_{2,k}$ is used to calculate the stopping index. As shown in FIG. 3, the present embodiment is configured to use the backward state metric signature vector $\vec{\tilde{\beta}}_{2,k}$ (i.e. $\vec{\rho}_{2,k}^{(i)}=\vec{\tilde{\beta}}_{2,k}^{(i)}$) generated by the second MAP decoding module 102. The backward state metric signatures of the second MAP decoding module 102 at the ith iteration are accumulated so as to calculate the stopping index $T_I$, where $$T_I \triangleq \sum_{\forall s \in S} \beta_{2,k}^{(i)}(s).$$

In the present embodiment, the turbo decoding module 10 receives a data block and performs iterative decoding. At the ith iteration, the second MAP decoding module 102 will transfer the backward state metric signature vector $\vec{\tilde{\beta}}_{2,k}$ to the stopping method module 20. The accumulator 201 of the stopping method module will accumulate all the backward state metric signatures $\beta_{2,k}^{(i)}(s)$ and save the result in stopping index variable $T_I$, i.e., $$T_I \triangleq \sum_{\forall s \in S} \beta_{2,k}^{(i)}(s).$$

Then, the decision unit 202 will compare the accumulated result of the stopping index variable $T_I$ with a threshold $\epsilon_s$. When the stopping index is less than the predetermined threshold, i.e., $T_I < \epsilon_s$, then the stopping signal 203 is generated to the turbo decoding module 10 so as to stop iterative decoding. Otherwise, the iteration is repeated until the stopping condition is fulfilled ($T_I < \epsilon_s$) or a fixed number of iterations are performed.

The Third Preferred Embodiment

Figure 4:
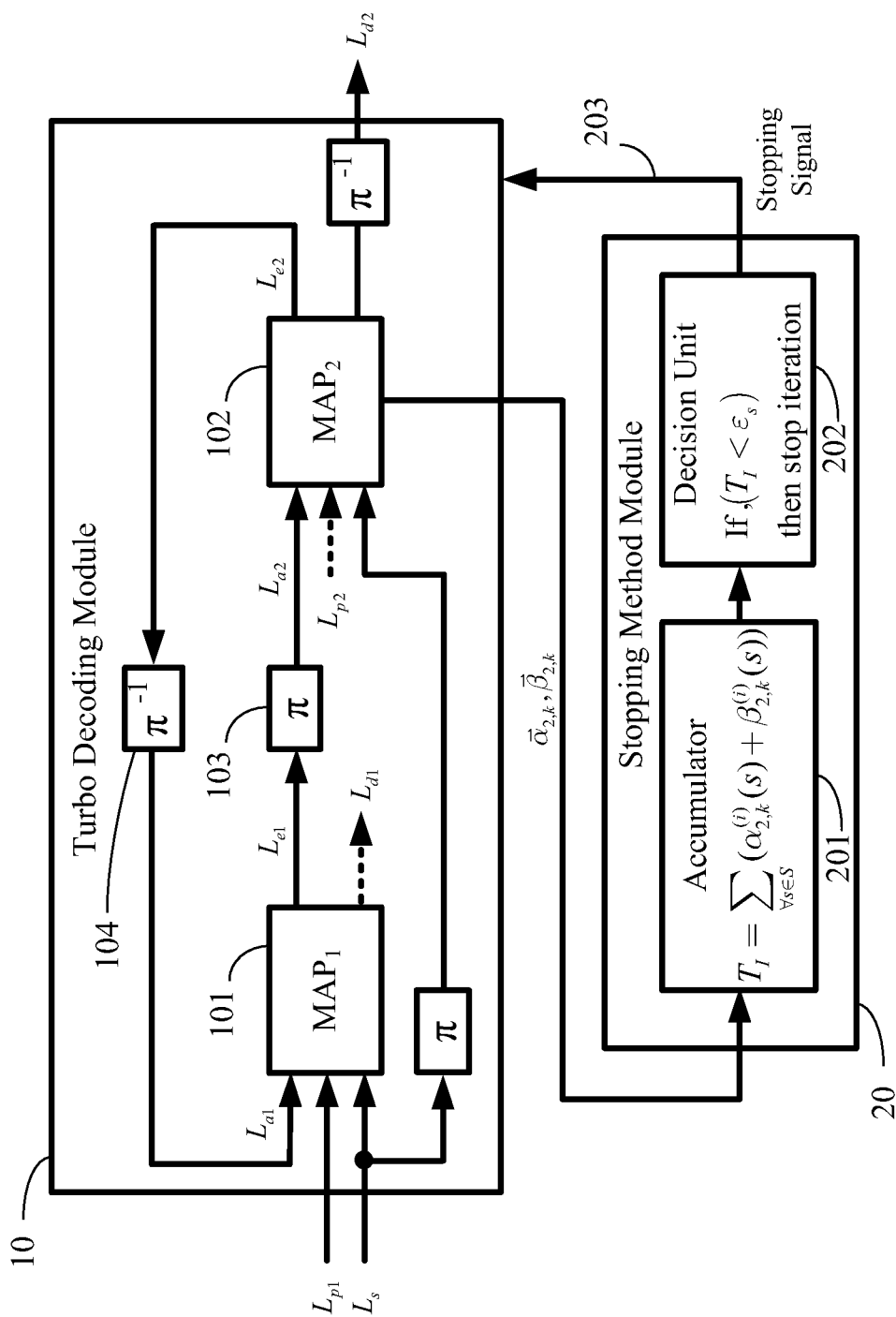
FIG. 4 is a block diagram illustrating a turbo decoder in the third embodiment of the present invention.

The present embodiment is a combination of the first embodiment and second embodiment. Instead of using $\vec{\alpha}_{2,k}$ or $\vec{\beta}_{2,k}$ alone, both of $\vec{\alpha}_{2,k}$ and $\vec{\beta}_{2,k}$ are used to calculate the stopping index. As shown in FIG. 4, the present embodiment is configured to use the forward state metric signature vector $\vec{\alpha}_{2,k}$ and the backward state metric signature vector $\vec{\beta}_{2,k}$ generated by the second MAP decoding module 102. At the ith iteration, all the state metric signatures of the second MAP decoding module 102 at time k are accumulated so as to calculate the stopping index $T_I$, where $$T_I \triangleq \sum_{\forall s \in S} (\alpha_{2,k}^{(i)}(s) + \beta_{2,k}^{(i)}(s)).$$

In the present embodiment, the turbo decoding module 10 receives a data block and performs iterative decoding. At the ith iteration, the second MAP decoding module 102 will transfer the state metric signature vectors $\vec{\alpha}_{2,k}$ and $\vec{\beta}_{2,k}$ to the stopping method module 20. The accumulator 201 of the stopping method module will accumulate all the state metric signatures $\alpha_{2,k}^{(i)}(s)$ and $\beta_{2,k}^{(i)}(s)$ and save the result in stopping index variable $T_I$, i.e., $$T_I \triangleq \sum_{\forall s \in S} (\alpha_{2,k}^{(i)}(s) + \beta_{2,k}^{(i)}(s)).$$

Then, the decision unit 202 will compare the accumulated result of the stopping index variable $T_I$ with a threshold $\epsilon_s$. When the stopping index is less than the predetermined threshold, i.e., $T_I < \epsilon_s$, then the stopping signal 203 is generated to the turbo decoding module 10 so as to stop iterative decoding. Otherwise, the iteration is repeated until the stopping condition is fulfilled ($T_I < \epsilon_s$) or a fixed number of iterations are performed.

The Forth Preferred Embodiment

Figure 5:
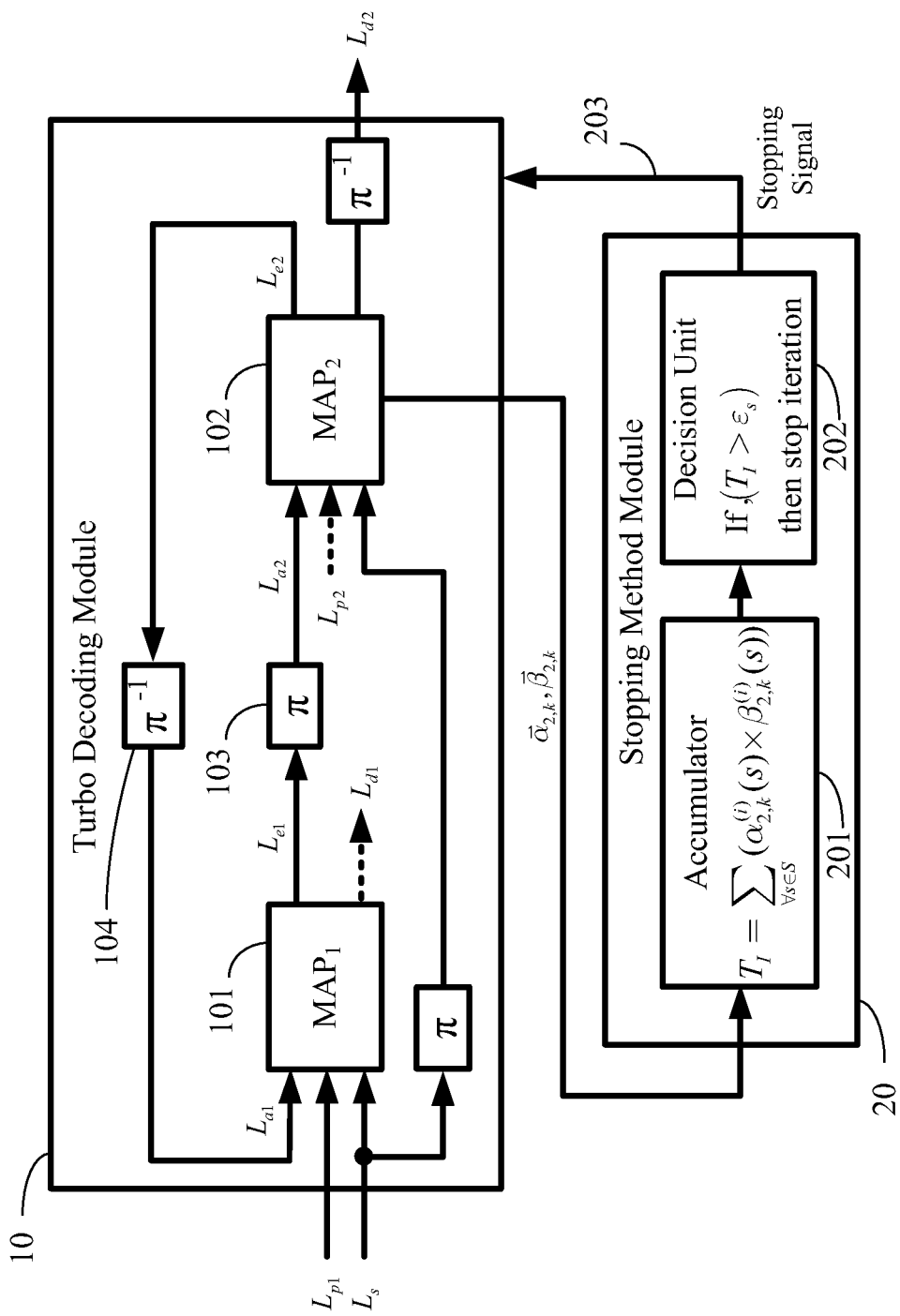
FIG. 5 is a block diagram illustrating a turbo decoder in the fourth embodiment of the present invention.

The present embodiment is a variant of the third embodiment. Instead of using vector summation of $\vec{\alpha}_{2,k}$ and $\vec{\beta}_{2,k}$, product of $\vec{\alpha}_{2,k}$ and $\vec{\beta}_{2,k}$ (i.e., $\vec{\alpha}_{2,k}^T \cdot \vec{\beta}_{2,k}$) are used to calculate the stopping index. As shown in FIG. 5, the present embodiment is configured to use the forward state metric signature vector $\vec{\alpha}_{2,k}$ and the backward state metric signature vector $\vec{\beta}_{2,k}$ generated by the second MAP decoding module 102. At the ith iteration, all the state metric signatures of the second MAP decoding module 102 at time k are accumulated so as to calculate the stopping index $T_I$, where $$T_I \triangleq \sum_{\forall s \in S} (\alpha_{2,k}^{(i)}(s) \times \beta_{2,k}^{(i)}(s)).$$

In the present embodiment, the turbo decoding module 10 receives a data block and performs iterative decoding. At the ith iteration, the second MAP decoding module 102 will transfer the state metric signature vectors $\vec{\alpha}_{2,k}$ and $\vec{\beta}_{2,k}$ to the stopping method module 20. The accumulator 201 of the stopping method module will accumulate each product of the state metric signatures $\alpha_{2,k}^{(i)}(s)$ and $\oplus_{2,k}^{(i)}(s)$ of same state and save the result in stopping index variable $T_I$, i.e., $$T_I \triangleq \sum_{\forall s \in S} (\alpha_{2,k}^{(i)}(s) \times \beta_{2,k}^{(i)}(s)).$$

Then, the decision unit 202 will compare the accumulated result of the stopping index variable $T_I$ with a threshold $\epsilon_s$. When the stopping index is greater than the predetermined threshold, i.e., $T_I > \epsilon_s$, then the stopping signal 203 is generated to the turbo decoding module 10 so as to stop iterative decoding. Otherwise, the iteration is repeated until the stopping condition is fulfilled ($T_I > \epsilon_s$) or a fixed number of iterations are performed.

The Fifth Preferred Embodiment

Figure 6:
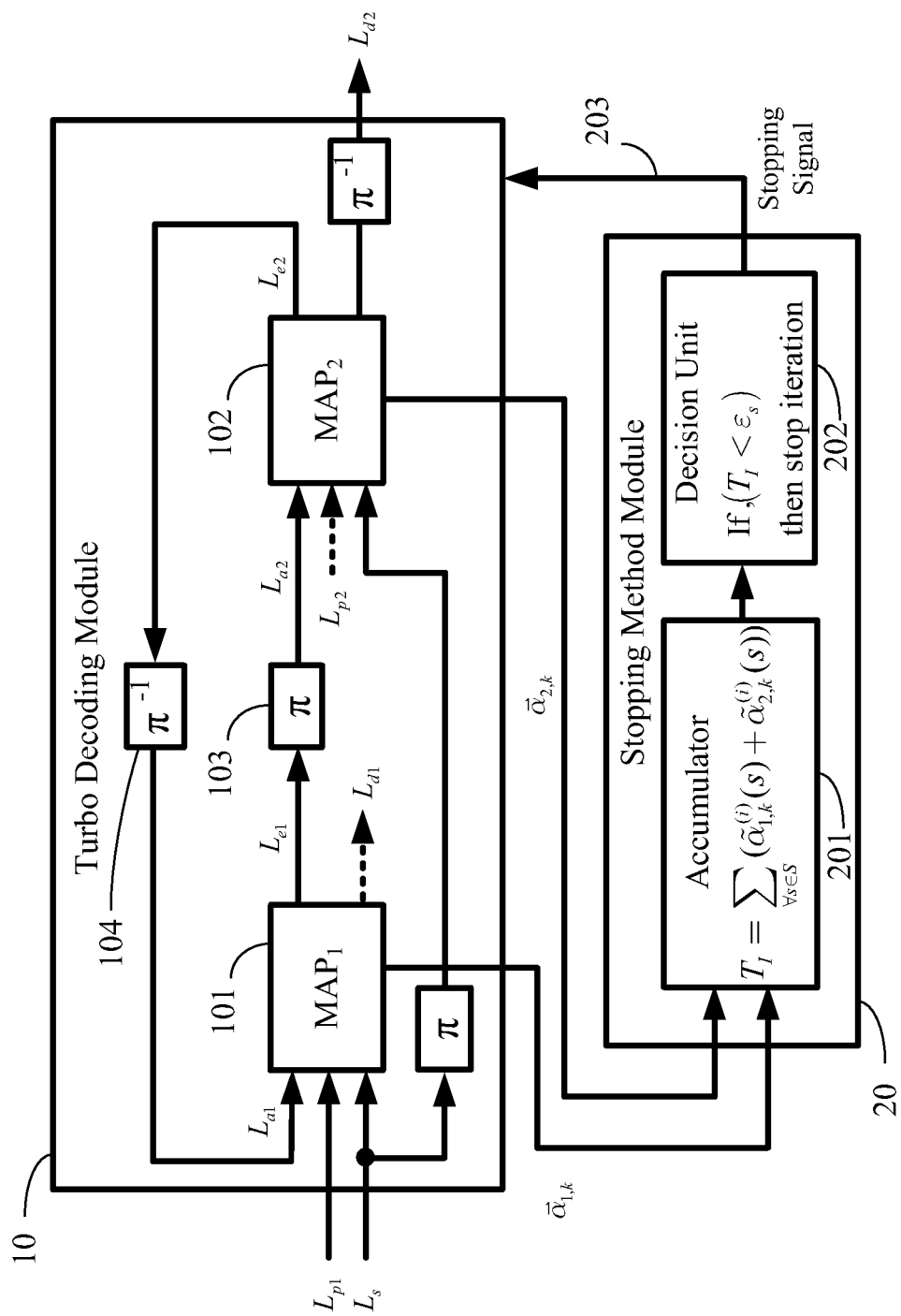
FIG. 6 is a block diagram illustrating a turbo decoder in the fifth embodiment of the present invention.

The present embodiment is an extension of the first embodiment. Instead of using $\vec{\alpha}_{2,k}$ from single stage of MAP decoding module, two stages of forward state metric signature vectors including $\vec{\alpha}_{1,k}$ and $\vec{\alpha}_{2,k}$ are used to calculate the stopping index. As shown in FIG. 6, the present embodiment is configured to use the forward state metric signature vector generated by the first MAP decoding module 101 and the second MAP decoding module 102. At the ith iteration, the forward state metric signatures of the first MAP decoding module 101 and the second MAP decoding module 102 are accumulated so as to calculate the stopping index $T_I$, where $$T_I \triangleq \sum_{\forall s \in S} (\alpha_{1,k}^{(i)}(s) + \alpha_{2,k}^{(i)}(s)).$$

The turbo decoding module 10 receives a data block and performs iterative decoding. At the ith iteration, the first MAP decoding module 101 will transfer the forward state metric signature vector $\vec{\alpha}_{1,k}$ to the stopping method module 20; then the second MAP decoding module 102 will transfer the forward state metric signature vector $\vec{\alpha}_{2,k}$ to the stopping method module 20. The accumulator 201 of the stopping method module will accumulate all the forward state metric signatures including $\alpha_{1,k}^{(i)}(s)$ and $\alpha_{2,k}^{(i)}(s)$ and save the result in stopping index variable $T_I$, i.e., $$T_I \triangleq \sum_{\forall s \in S} (\alpha_{1,k}^{(i)}(s) + \alpha_{2,k}^{(i)}(s)).$$

Then, the decision unit 202 will compare the accumulated result of the stopping index variable $T_I$ with a threshold $\epsilon_s$. When the stopping index is less than the predetermined threshold, i.e., $T_I < \epsilon_s$, then the stopping signal 203 is generated to the turbo decoding module 10 so as to stop iterative decoding. Otherwise, the iteration is repeated until the stopping condition is fulfilled ($T_I < \epsilon_s$) or a fixed number of iterations are performed.

In order to demonstrate the efficiency of the present invention, simulations were conducted to verify the performance of different embodiments in the present invention. The simulation parameters are as follows. The turbo code constructed by parallel concatenating two (7,5) recursive systematic convolutional codes with zero-state trellis termination via a quadratic polynomial permutation (QPP) interleaver is used. The data block length is 6144 and the code rate is 1/3. The Log- MAP algorithm is used as the MAP decoding algorithm. The threshold is targeted to the BER performance less than $10^{-5}$. At the mean time, the maximum number of iteration is limited to 8.

Figure 7:
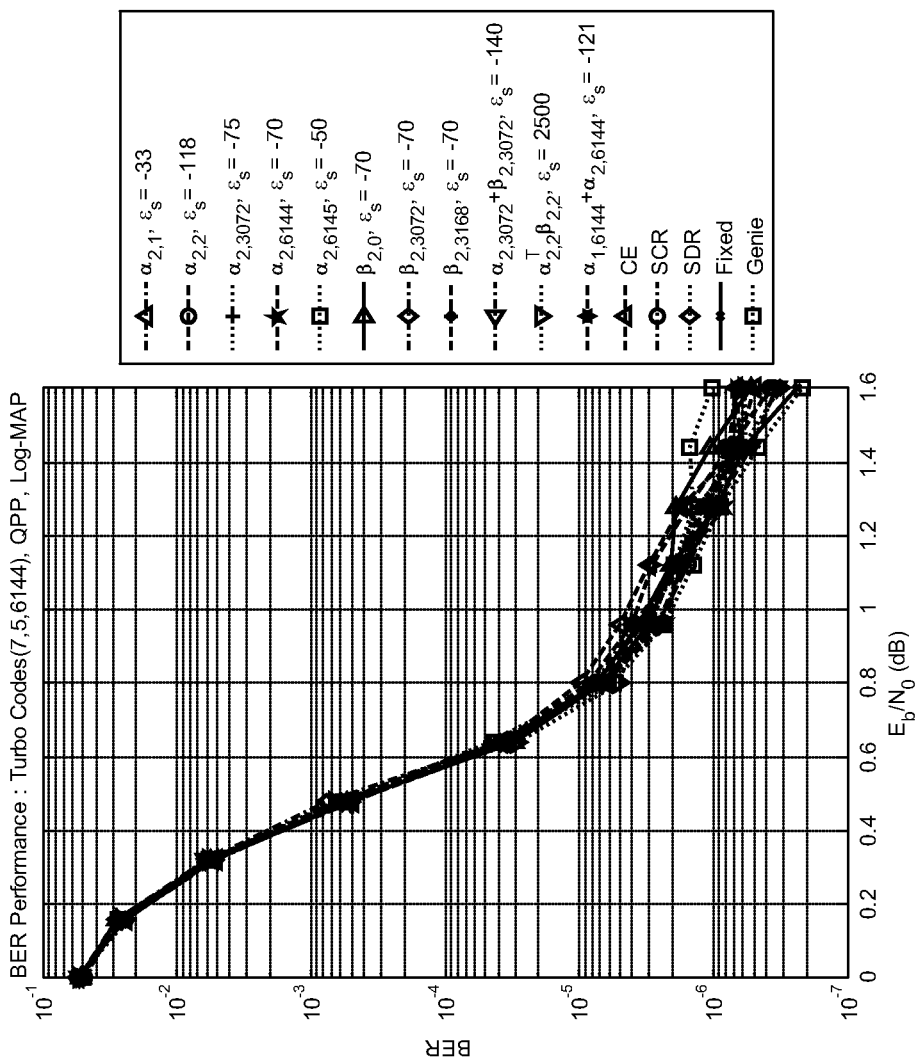
FIG. 7 is the BER performance comparison of different embodiments of the present invention and prior art.

As shown in FIG. 7, it is the BER performance comparison of the different embodiments in the present invention and the prior art of soft information class. Different parameters for each embodiment are used in the simulations to demonstrate the efficiency of the present invention. The threshold $\epsilon_s$ for each embodiment is appended in each simulation case, respectively. The prior art includes CE, SCR, and SDR methods. The horizontal axis is the ratio of bit energy to noise power spectral density ($E_b/N_0$) in dB, where $E_b$ is the energy per bit and $N_0$ is noise power spectral density. The vertical axis is the BER performance. In addition, the Genie line is the virtually ideal stopping method. The Fixed line is the decoding method of conventional decoder for always decoding eight iterations. As shown in FIG. 7, the requirement of the target BER performance is achieved for the different embodiments in the present invention and prior art when $E_b/N_0$ is greater 0.8 dB.

Figure 8:
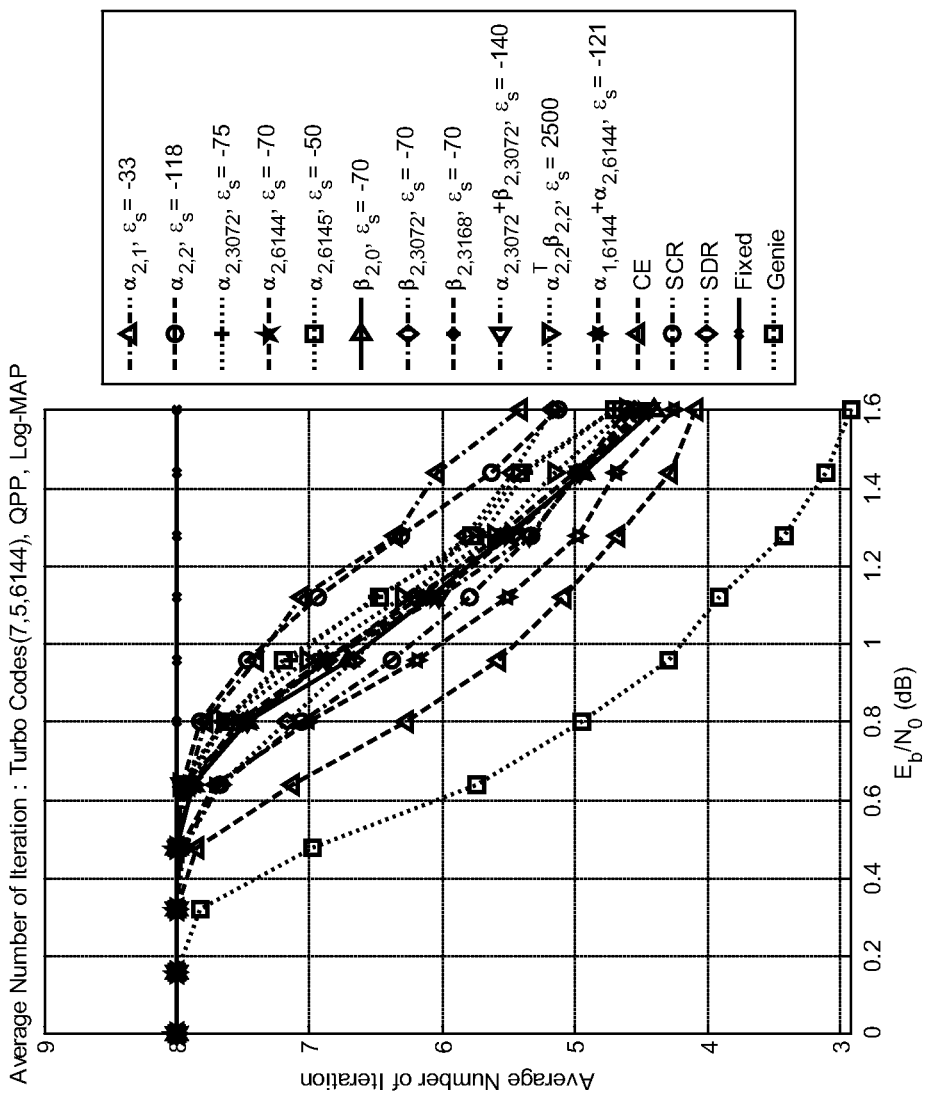
FIG. 8 is the average number of iterations of different embodiments of the present invention and prior art.

As shown in FIG. 8, it is the comparison diagram of the average number of iterations for the different embodiments in the present invention and prior art. The horizontal line is $E_b/N_0$ and the vertical line is the average number of iteration. The iteration numbers of most embodiments are close to the SCR and SDR when the $E_b/N_0$ is greater than 1.2 dB. The fifth embodiment for time instant 6144 is better than the SCR. The first embodiment for time instant 1 and 2 is worse than the SDR. When the $E_b/N_0$ is low (e.g., $E_b/N_0$<0.5 dB) and the signal strength is weak, all methods perform poor in this region.

Obviously, the different embodiments in the present invention are able to save the number of iterations for a given target BER performance. The advantages of the present invention are low memory requirement and without complicated calculations. When the stopping method is made in a chip, the area of the chip is also reduced effectively. When the stopping method is used in handheld or portable devices, the durability is better.

Based on the principle of using a plurality of forward state metric signature vectors from different decoding steps in the fifth embodiment and the principle of combining forward and backward state metric signature vectors in the third and fourth embodiments, it is obvious these principles can be extended to other embodiments in the present invention. The effect of using a plurality of state metric signature vectors and combining forward and backward state metric signature vectors will be beneficial to the tradeoff of performance and complexity. Therefore, only some sample parameters are used in the simulations for demonstration, which are not intended to limit the scope of the present invention. Obviously, these embodiments can be practiced by the connection relationship similar to FIG. 6; the difference is the state metric signature vectors used to calculate the stopping index, the definition and calculation of the stopping index $T_I$, and comparison relation in the decision unit. Also, the plurality of MAP decoding modules in turbo decoding module can be implemented by sharing a single instance of MAP decoding module.

Though the parallel turbo code is used in the present invention, it is not limited herein due to the MAP decoding module is applicable to all kind of iterative signal processing for convolutionally coded signals. A plurality of MAP decoding modules in the present invention can be used to iteratively process the parallel, serial, or hybrid concatenation of convolutionally coded signals and systems, such as serial turbo codes, turbo equalization, turbo detection and other iterative signal processing. Furthermore, the stopping method of iterative signal processing in the present invention can be embedded in a chip and executed as an iterative signal processor; and it is also used in the way of software, the stopping method of iterative signal processing is implemented in software program to be executed. For example, the stopping method of iterative signal processing is saved in a computer-readable medium and then called to be executed by main program.

It should be noted that the main feature of the present invention is to transfer and utilize the state metric signature of MAP decoding module at a particular time instant instead of the a-priori information, extrinsic information or APP values of an entire data block.

Furthermore, the turbo code in the present invention is implemented in apparatus such as handheld devices, portable devices or base stations in cellular communication systems, which includes at least one antenna to receive a radio frequency signal with convolutionally coded baseband signals such as turbo codes, multipath fading signals, multi-antenna signals, etc., an demodulator connected with the antenna and configured to demodulate the radio frequency signal to the convolutionally coded baseband signals, and an iterative signal processor connected with the demodulator and configured to do the iterative signal processing for the convolutionally coded baseband signals. An iterative signal processor such as turbo decoder, turbo equalizer or turbo detector, etc. implemented by at least one MAP decoding module, and the MAP decoding module output at least one state metric signature vector during iterative processing process. The stopping method module includes an accumulator configured to accumulate the state metric signatures generated by the MAP decoding module into a stopping index variable. In addition, a decision unit configured to compare the stopping index variable with a predetermined threshold for stopping iterative decoding, when the stopping index is less than the predetermined threshold, the decision unit will output a stopping signal to the iterative signal processing module and the iterative decoding is determined to be stopped.

Although specific embodiments have been illustrated and described, it will be appreciated by those skilled in the art that various modifications may be made without departing from the scope of the present invention, which is intended to be limited solely by the appended claims.

What is claimed is:

1. A method for stopping an iterative MAP decoding of convolutionally coded signals, the method comprising:
   (a) selecting an integer value k, $1 \le k \le N+v$, where N is the data block length of said convolutionally coded signals and v is the memory length of said convolutionally coded signals;
   (b) providing at least one MAP decoding module to perform said iterative MAP decoding of said convolutionally coded signals;
   (c) generating a state metric signature vector at kth time instant by said MAP decoding module during said iterative MAP decoding;
   (d) accumulating state metric signatures in said state metric signature vector into a stopping index variable;
   (e) setting a predetermined threshold;
   (f) comparing said stopping index variable with said predetermined threshold; and
   (g) stopping said iterative MAP decoding when said stopping index variable is less than said predetermined threshold.

2. The method according to claim 1, wherein two MAP decoding modules are provided.

3. The method according to claim 2, wherein said MAP decoding modules are in parallel concatenation.

4. The method according to claim 1, wherein said state metric signature vector is forward state metric signature vector and said state metric signatures are forward state metric signatures.

5. The method according to claim 1, wherein the step (c) is generating a forward state metric signature vector and a backward state metric signature vector at said kth time instant by said MAP decoding module during said iterative MAP decoding, and the step (d) is
   accumulating forward state metric signatures of different states in said forward state metric signature vector and backward state metric signatures of different states in said backward state metric signature vector into said stopping index variable.

6. The method according to claim 1, wherein the step (c) is generating a backward state metric signature vector at said kth time instant by said MAP decoding module during said iterative MAP decoding, and the step (d) is accumulating backward state metric signatures in said backward state metric signature vector into said stopping index variable.

7. A method for stopping an iterative MAP decoding of convolutionally coded signals, the method comprising:
   (a) selecting an integer value k, $1 \leq k \leq N+v$, where N is the data block length of said convolutionally coded signals and v is the memory length of said convolutionally coded signals;
   (b) providing at least one MAP decoding module to perform said iterative MAP decoding of said convolutionally coded signals;
   (c) generating a forward state metric signature vector at kth time instant by said MAP decoding module during said iterative MAP decoding;
   (d) generating a backward state metric signature vector at said kth time instant by said MAP decoding module during said iterative MAP decoding;
   (e) accumulating each product of forward state metric signature in said forward state metric signature vector and backward state metric signature of same state in said backward state metric signature vector into a stopping index variable;
   (f) setting a predetermined threshold;
   (g) comparing said stopping index variable with said predetermined threshold; and
   (h) stopping said iterative MAP decoding when said stopping index variable is greater than said predetermined threshold.

8. The method according to claim 7, wherein two MAP decoding modules are provided.

9. The method according to claim 8, wherein said MAP decoding modules are in parallel concatenation.

10. An iterative signal processor for decoding convolutionally coded signals, comprising:
    an iterative signal processing module including a plurality of MAP decoding modules and said plurality of MAP decoding modules output at least one state metric signature vector at kth time instant during an iterative MAP decoding process performed by the iterative signal processor, wherein k is a selected integer value satisfying $1 \leq k \leq N+v$, where N is the data block length of said convolutionally coded signals and v is the memory length of said convolutionally coded signals; and
    a stopping method module including:
       an accumulator configured to accumulate a plurality of state metric signatures in said state metric signature vector into a stopping index variable; and
       a decision unit configured to compare said stopping index variable with a predetermined threshold, when said stopping index variable is less than said predetermined threshold, said decision unit will output a stopping signal to said iterative signal processing module, and said iterative MAP decoding is determined to be stopped.

11. The iterative signal processor according to claim 10, wherein the number of said MAP decoding module is two.

12. The iterative signal processor according to claim 11, wherein said MAP decoding modules are in parallel concatenation.

13. The iterative signal processor according to claim 10, wherein said state metric signature vector is forward state metric signature vector and said state metric signatures are forward state metric signatures.

14. The iterative signal processor according to claim 10, wherein said state metric signature vector is backward state metric signature vector and said state metric signatures are backward state metric signatures.

15. The iterative signal processor according to claim 10, wherein said at least one state metric signature vector including a forward and a backward state metric signature vectors generated by said at least one MAP decoding module at said kth time instant.

16. The iterative signal processor according to claim 10, wherein said processor is implemented in integrated circuit.

* * * * *